(12) United States Patent
Needham et al.

(10) Patent No.: US 10,998,461 B2
(45) Date of Patent: May 4, 2021

(54) SOLAR CANOPY SYSTEM

(71) Applicant: FCX Solar LLC, Mont Vernon, NH (US)

(72) Inventors: Christopher Thomas Needham, Mountain View, HI (US); Frank Carl Oudheusden, Mont Vernon, NH (US)

(73) Assignee: RBI Solar, Inc., Cincinnati, OH (US)

( * ) Notice: Subject to any disclaimer, the term of this patent is extended or adjusted under 35 U.S.C. 154(b) by 259 days.

(21) Appl. No.: 15/983,937

(22) Filed: May 18, 2018

(65) Prior Publication Data

US 2018/0269343 A1 Sep. 20, 2018

Related U.S. Application Data

(63) Continuation of application No. 15/692,787, filed on Aug. 31, 2017, now Pat. No. 9,985,154.

(Continued)

(51) Int. Cl.
*H01L 31/042* (2014.01)
*H02S 20/23* (2014.01)
*F24S 50/60* (2018.01)
*F24S 25/00* (2018.01)
*F24S 25/12* (2018.01)
(Continued)

(52) U.S. Cl.
CPC ............ *H01L 31/042* (2013.01); *F24S 20/67* (2018.05); *F24S 25/00* (2018.05); *F24S 25/12* (2018.05); *F24S 40/85* (2018.05); *F24S 50/60* (2018.05); *H02S 20/23* (2014.12); *H02S 20/10* (2014.12); *Y02B 10/10* (2013.01); *Y02B 10/20* (2013.01); *Y02E 10/44* (2013.01); *Y02E 10/47* (2013.01)

(58) Field of Classification Search
CPC ....... H01L 31/042; H02S 20/23; H02S 20/10; F24J 2/405; F24J 2/5201; F24S 25/00; F24S 25/12; F24S 40/85; F24S 50/60; F24S 20/67; Y02E 10/44; Y02E 10/47; Y02E 10/50
See application file for complete search history.

(56) References Cited

U.S. PATENT DOCUMENTS

| | | | |
|---|---|---|---|
| 2010/0108113 A1* | 5/2010 | Taggart | H02S 20/10 135/96 |
| 2017/0365730 A1 | 12/2017 | Needham et al. | |
| 2018/0026576 A1* | 1/2018 | Danning | F24S 25/16 52/173.3 |

OTHER PUBLICATIONS

Minimum Design Loads for Buildings and Other Structures, American Society of Civil Engineers, ASCE Standard ASCE/SEI 7-10, Ch.27, pp. 259-271.

(Continued)

*Primary Examiner* — Matthew T Martin
(74) *Attorney, Agent, or Firm* — Perkins Coie LLP

(57) ABSTRACT

A solar canopy has a solar panel assembly including a first solar panel coupled to a second solar panel and oriented non-parallel with respect to the second solar panel. The solar panel assembly has an effective solar-panel-assembly wind loading less than a sum of a first-solar-panel effective wind loading and a second-solar-panel effective wind loading determined individually. An actual load applied by the solar panel assembly to a solar-panel-assembly support structure coupled thereto when the solar panel assembly is subject to a wind loading is less than a design load for the solar panel assembly subject to the wind loading based on a sum of a first-solar-panel net pressure and a second-solar-panel net pressure determined independently.

20 Claims, 6 Drawing Sheets

Related U.S. Application Data

(60) Provisional application No. 62/406,686, filed on Oct. 11, 2016.

(51) Int. Cl.
    *F24S 40/80*     (2018.01)
    *F24S 20/67*     (2018.01)
    *H02S 20/10*     (2014.01)

(56) References Cited

OTHER PUBLICATIONS

Notice of Allowance dated Apr. 27, 2018 of U.S. Appl. No. 15/692,787 by Needham, C.T., et al., filed Aug. 31, 2017.
Notice of Allowance dated Mar. 13, 2018 of U.S. Appl. No. 15/692,787 by Needham, C.T., et al., filed Aug. 31, 2017.
Non-Final Office Action dated Oct. 24, 2017 of U.S. Appl. No. 15/692,787 by Needham, C.T., et al., filed Aug. 31, 2017.
U.S. Appl. No. 15/692,787 by Needham, C.T., et al., filed Aug. 31, 2017.

* cited by examiner

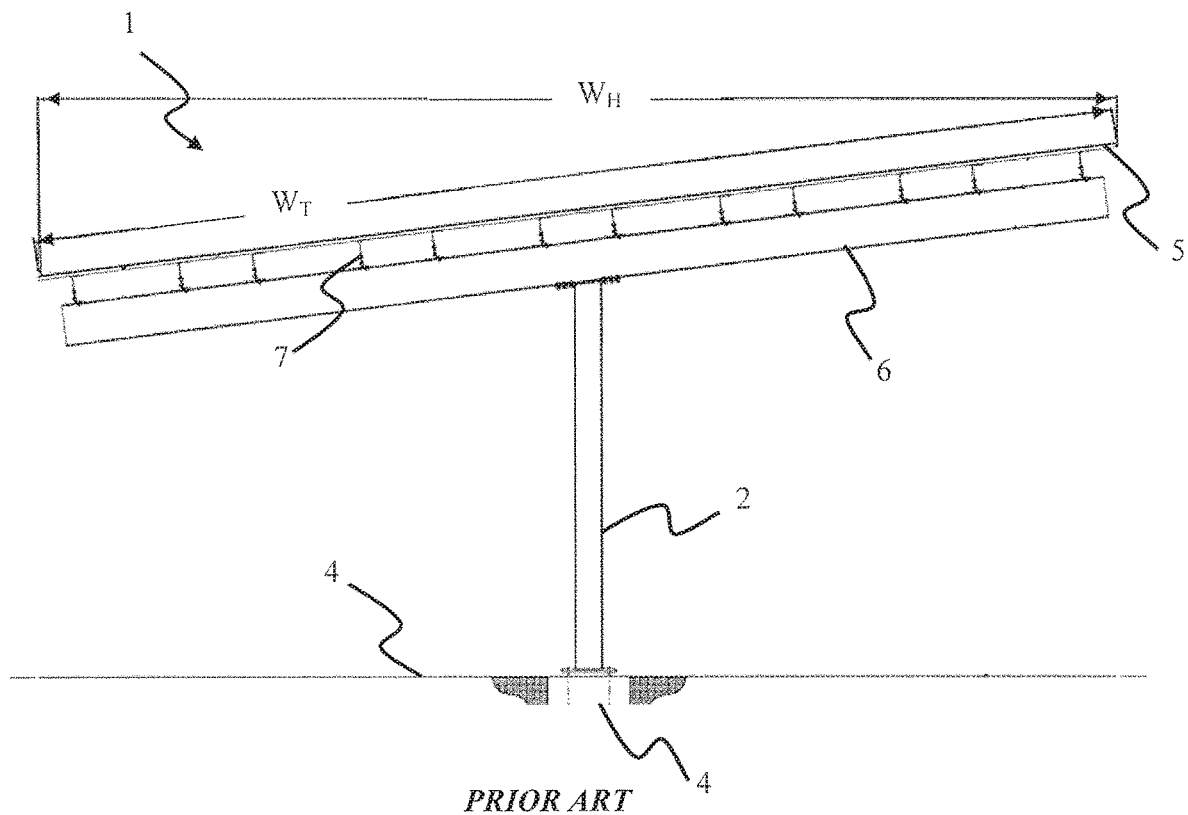
PRIOR ART
Fig. 1
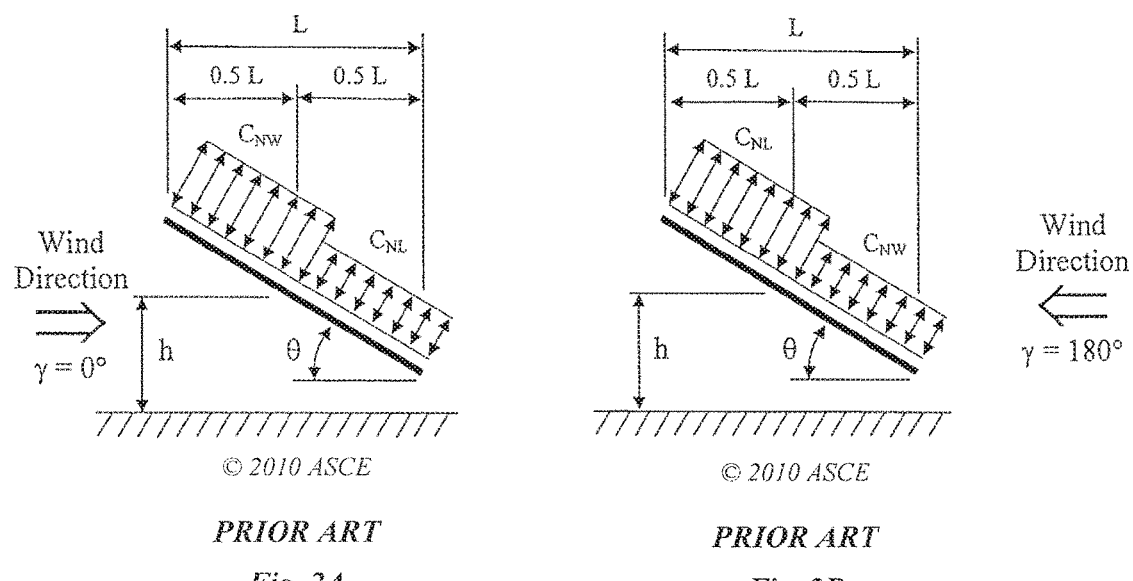
© 2010 ASCE
PRIOR ART
Fig. 2A
© 2010 ASCE
PRIOR ART
Fig. 2B

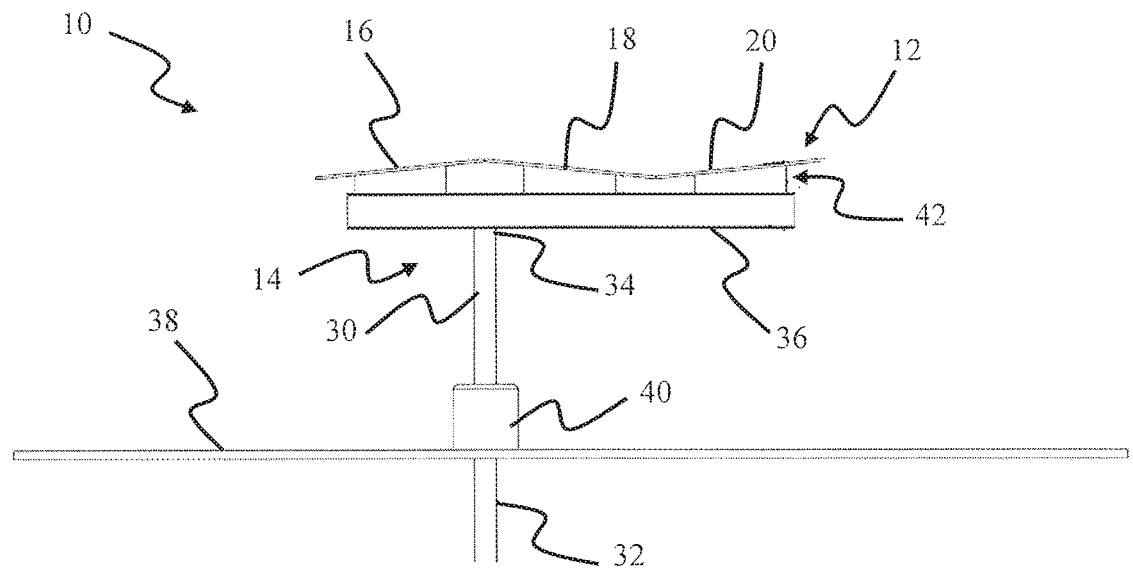
*Fig. 5*
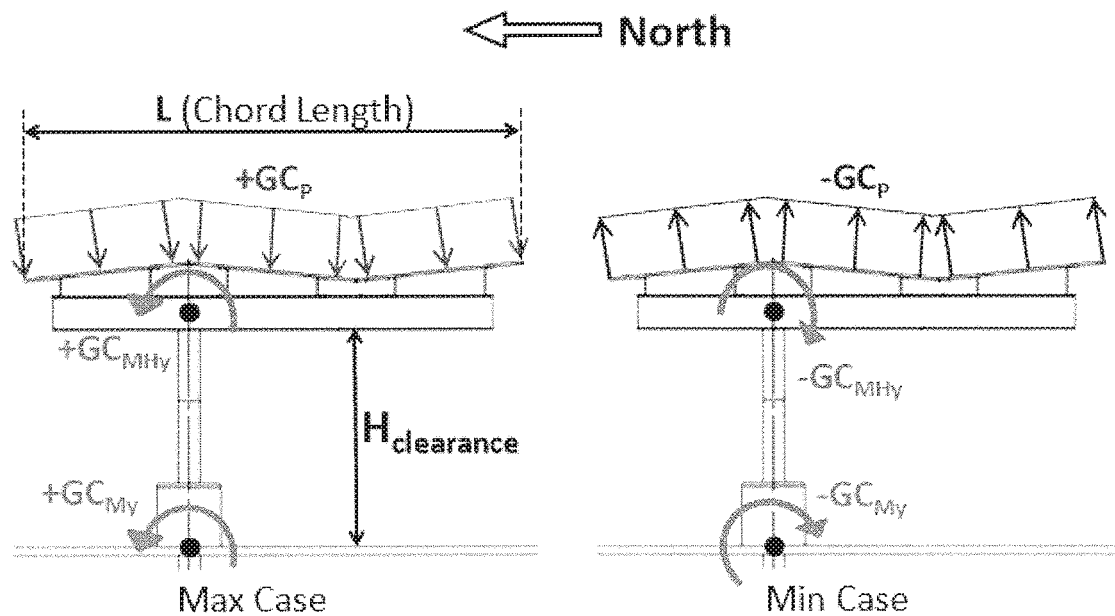
*Fig. 6A*    *Fig. 6B*

SOLAR CANOPY SYSTEM

CROSS-REFERENCE TO RELATED APPLICATION(S)

This application is continuation U.S. patent application Ser. No. 15/692,787, filed Aug. 31, 2017, now U.S. Pat. No. 9,985,154, issued May 29, 2018, which claims the benefit of U.S. Provisional Patent Application No. 62/406,686, filed Oct. 11, 2016, which are incorporated by reference herein in their entirety.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

The present invention relates to a solar canopy system and method for reducing canopy support structure design loadings. More particularly, the present invention relates to a solar canopy system having two or more non-parallel solar panel assemblies having a support structure design based on instantaneous time averaging of the measured wind loadings of the two or more non-parallel solar panels.

One obstacle to cost reduction of solar photovoltaic (PV) canopy structures is the wind loading prescribed by building codes. Currently, the majority of the canopy structure vendors in the industry do not utilize wind tunnel testing as measuring the wind loading on coplanar panel assemblies does not yield a useful decrease in loading compared to code prescribed loads.

The PV canopy structures available openly in the industry have substantially the same general configuration as the monoslope free roof PV canopy shown in FIG. 1 and hereafter referred to as the monoslope PV canopy 1. Generally, the monoslope PV canopy 1 has a vertical post 2 extending above a grade 3 and anchored below the grade 3 by a foundation 4. One or more solar panels 5 are supported on a beam 6 by purlins 7 extending between the panels 5 and the beam 6. The beam 6, in turn, is mounted on the post 2 at an angle $\theta$, such that the total canopy protected (or horizontal) width $W_H$ is less than the total canopy panel width $W_T$.

The structure of the monoslope PV canopy 1 may be found in the American Society of Civil Engineers Standard for Minimum Design Loads for Buildings and Other Structures, ASCE/SEI 7-10 (hereafter referred to as ASCE 7-10) in FIG. 27.4-4 for monoslope free roofs, a portion of which is reproduced in FIGS. 2A and 2B herein. The direction of the wind $\gamma$ in FIG. 2A is zero degrees; the direction of the wind $\gamma$ in FIG. 2B is one-hundred eighty degrees. $C_{NW}$ and $C_{NL}$ are the net pressure contributions from the top and bottom surfaces for the windward and leeward half of the roof surfaces, respectively. "L" is the horizontal length of the roof measured in the along wind direction. "h" is the mean roof height. $\theta$, is the angle of the plane of the roof from horizontal. The net instantaneous wind loadings $C_{NW}$ and $C_{NL}$ are determined by wind tunnel testing and are provided in ASCE 7-10, FIG. 27.4-4 for roof angles from zero to forty-five degrees.

It is well accepted within the solar power industry that the wind pressures prescribed in ASCE 7-10, FIG. 27.4-4 are representative of the real world loading of these structures. For this reason, the largest suppliers of PV canopy structures do not typically utilize any wind tunnel testing in the design of their products.

The pitched roof PV canopy structure shown in FIG. 3 is one example of a structure with two or more non-parallel planes of solar panel surfaces. Currently, this type of structure is not widely utilized within the industry although examples do exist. There are several downsides to this structure when compared to the structure shown in FIG. 1 including energy production ("yield"), direct current (DC) and alternating current (AC) wiring costs, and structural costs. Furthermore, the wind loading coefficients prescribed for canopy structures with two or more non-parallel planes of solar panels can result in higher wind loading and thus higher costs than the single plane of solar panels design. These coefficients can be seen to be as high for pitched free roofs and troughed free roofs as for monoslope free roofs (See, ASCE 7-10, FIG. 27.4-5 and FIG. 27.4-6, not shown herein). As shown diagrammatically in FIG. 3, for non-parallel panel surfaces that are not sufficiently structurally connected to allow net, instantaneous pressure measurements across the total combined area, wind loads F1 and F2 are currently determined separately and the total net wind load F3 is calculated as the sum of the worst-case F1 and F2 load measurements, which occur at different times. In contrast to the total net wind load F3 shown in FIG. 3, the net, instantaneous pressure measurements of the total area of structurally connected, non-parallel panel surfaces results in a lower total force F3' as shown in FIG. 4 since in this instance, the loads F1' and F2' are in opposite directions and occur at the same time.

Accordingly, under current practice, the wind loading coefficients prescribed for canopy structures with two or more non-parallel planes of solar panels (see, FIG. 3) can result in higher wind loading and thus higher costs than the single plane of solar panels designs based on the wind loading coefficients shown in ASCE 7-10, FIG. 27.4-4. Therefore, there is a need for a design methodology for canopy support structures for two or more non-parallel planes of solar panels based on determining the net instantaneous wind loading across the total combined area of the non-parallel planes of solar panels.

SUMMARY

Briefly stated, one embodiment of the present invention is directed to a solar canopy including a solar panel assembly and a solar-panel-assembly support structure coupled to the solar panel assembly. The solar panel assembly comprises a first solar panel having a total wind-exposed first-solar-panel surface area and a second solar panel having a total wind-exposed second-solar-panel surface area. The second solar panel is coupled to the first solar panel and oriented non-parallel with respect to the first solar panel. The solar panel assembly has an effective solar-panel-assembly wind loading less than a sum of a first-solar-panel effective wind loading and a second-solar-panel effective wind loading determined individually. The solar-panel-assemble support structure includes a post having a post bottom end and a post top end spaced from the post bottom end. A cross beam is attached to and supported by the post top end. A plurality of purlins extend between the cross beam and the first-solar-panel and between the cross beam and the second-solar-panel. An actual load applied by the solar panel assembly through the purlins and cross beam to the post when the solar panel assembly is subject to a wind loading is less than a design load for the solar panel assembly subject to the wind loading based on a sum of a first-solar-panel net pressure for the first solar panel and a second-solar-panel net pressure for the second solar panel, the first-solar-panel net pressure and the second-solar-panel net pressure determined independently.

BRIEF DESCRIPTION OF THE DRAWINGS

The following detailed description of preferred embodiments of the invention, will be better understood when read in conjunction with the appended drawings. For the purpose of illustrating the invention, there is shown in the drawings embodiments which are presently preferred. It should be understood, however, that the invention is not limited to the precise arrangements and instrumentalities shown.

In the drawings:

FIG. 1 is a side elevation view of a prior art canopy comprising a plurality of single, parallel plane photovoltaic solar panels;

FIGS. 2A and 2B are portions of ASCE 7-10, FIG. 27.4-4 showing the net pressure contributions from the top and bottom surfaces of a monoslope free roof for the windward and leeward half of the surfaces for a typical application of wind loads as specified in ASCE Standard 7-10;

FIG. 5 is a side elevation view of a preferred embodiment of a solar panel assembly comprising three non-parallel panel surfaces in accordance with the present invention;

FIGS. 6A and 6B are schematic diagrams of the solar panel assembly of FIG. 5 showing maximum and minimum wind loading, respectively;

DETAILED DESCRIPTION

Figure 3:
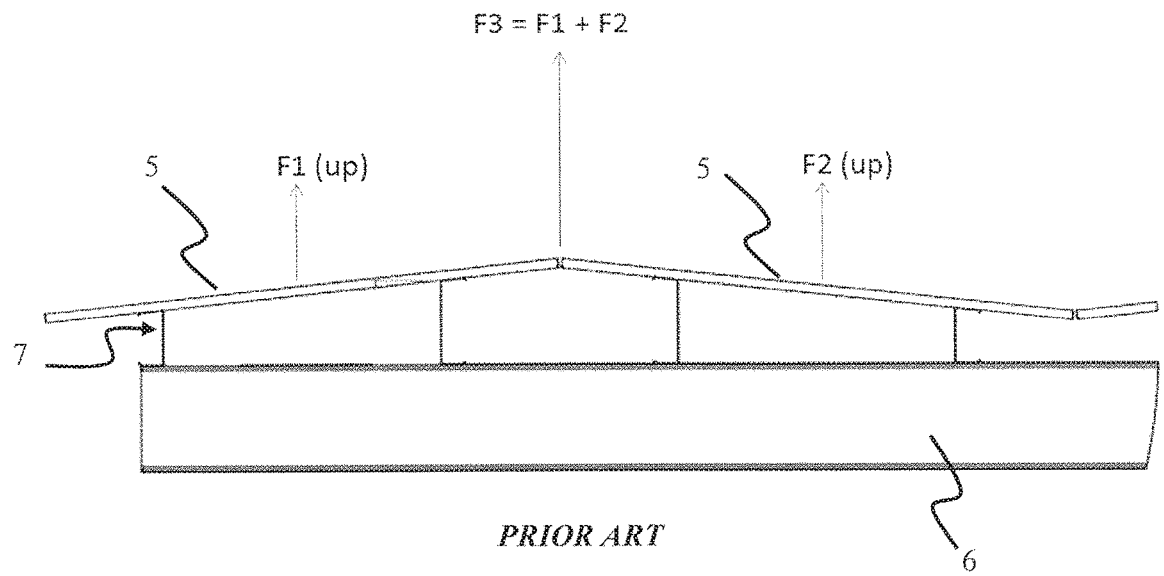
FIG. 3 is a schematic diagram showing how the net wind load F3 is currently evaluated for non-parallel panel surfaces that are not sufficiently structurally connected to allow net, instantaneous pressure measurements across the total combined area.
Figure 4:
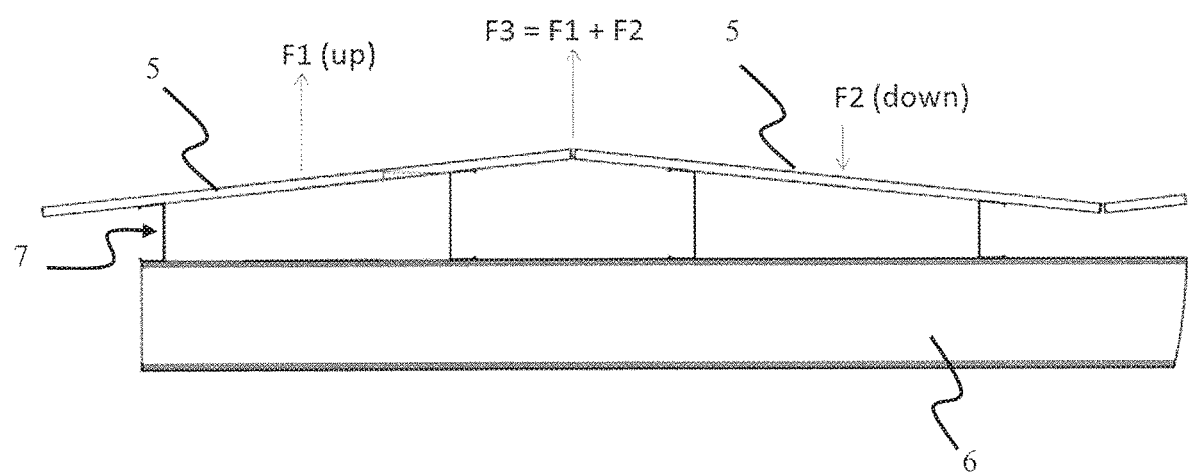
FIG. 4 is a schematic diagram showing a first preferred embodiment of the method for determining the net wind load F3' for non-parallel panel surfaces in accordance with the present invention.

Reference will now be made in detail to embodiments of the invention, examples of which are illustrated in the accompanying drawings. The terminology used in the description of the invention herein is for the purpose of describing particular embodiments only and is not intended to be limiting of the invention.

As used in the description of the invention and the appended claims, the singular forms "a", "an" and "the" are intended to include the plural forms as well, unless the context clearly indicates otherwise. The words "and/or" as used herein refers to and encompasses any and all possible combinations of one or more of the associated listed items. The words "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The words "right," "left," "lower" and "upper" designate directions in the drawings to which reference is made. The words "inwardly" and "outwardly" refer to directions toward and away from, respectively, the geometric center of the solar canopy, and designated parts thereof. The terminology includes the words noted above, derivatives thereof and words of similar import.

Although the words first, second, etc., are used herein to describe various elements, these elements should not be limited by these words. These words are only used to distinguish one element from another. For example, a first panel could be termed a second panel, and, similarly, a panel tube could be termed a first panel, without departing from the scope of the present invention.

As used herein, the words "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

The following description is directed towards various embodiments of a solar canopy in accordance with the present invention.

Referring to the drawings in detail, where like numerals indicate like elements throughout, there is shown in FIGS. 5 and 6 a first preferred embodiment of the solar canopy, generally designated 10, and hereinafter referred to as the "canopy" 10 in accordance with the present invention.

The canopy 10 comprises a three panel (or 3P) solar panel assembly 12 supported by and coupled to a solar-panel-assembly support structure 14 as further described below. The solar panel assembly 12 comprises at least a first solar panel 16 with a total wind-exposed first-solar-panel surface area and a second solar panel 18 with a total wind-exposed second-solar-panel surface area. The solar panel assembly 12 may have a third solar panel 20 with a total wind-exposed third-solar-panel surface area. Preferably, the solar panel assembly 12 has a rectilinear array of solar panels including the first, second and third solar panels 16, 18, 20. The total number of solar panels comprising the array is a design choice based on the desired electrical output of the assembly. Typically, the solar panel assembly 12 includes at least adjacent six rows with three panels per row but could have more than six rows or less than six rows without departing from the spirit of the invention.

The second solar panel 18 is coupled to the first solar panel 16 such that the second solar panel 18 is oriented non-parallel with respect to the first solar panel 16. The third solar panel 20 is oriented non-parallel with respect to the second solar panel 18. The manner in which the panels 16, 18, 20 are coupled to each other can be by any of a number of well known couplings used in the solar canopy industry, is not part of the claimed invention and for brevity is not disclosed herein. Preferably the first and second solar panels 16, 18 are tilted about 5-7 degrees from the horizontal, the first solar panel 16 being tilted in a counter clockwise direction and the second solar panel being tilted in a clockwise direction. The degree of tilt can be more or less than the about 5-7 degrees without departing from the spirit of the invention. However, the tilt angle could be less than five degrees or more than seven degrees without departing from the spirit of the invention. The third solar panel 20 may be tilted parallel to the first solar panel; alternatively, the third solar panel 20 may be oriented non-parallel with respect to the first solar panel 16 and tilted in the counter clockwise direction at an angle different than the tilt angle of the first solar panel 16.

The solar panel assembly 12 has an effective solar-panel-assembly wind loading less than a sum of a first-solar-panel effective wind loading and a second-solar-panel effective wind loading determined individually. The effective solar-panel-assembly wind loading is determined by wind tunnel testing of the solar panel assembly 12 whereby instantaneous time averaging of the measured pressures of two or more non-parallel solar panel assemblies determines the net wind loading as further discussed below.

The solar-panel-assembly support structure 14 comprises a post 30 having a post bottom end 32 and a post top end 34 spaced from the post bottom end 32. A cross beam 36 is attached to and supported by the post top end 34. The post bottom end 32 may be embedded directly in the ground 38. Preferably, but not necessarily, the post bottom end 32 is attached to a foundation 40 in the ground 38. A plurality of purlins 42 extend between the cross beam 36 and the first, second and third solar panels 16, 18, 20 and support and attach the first, second and third solar panels 16, 18, 20 to the cross beam 36. The purlins 42 vary in length in order to achieve the desired tilt of the solar panels 16, 18, 20. The purlins 42 can have a variety of well known geometric shapes and are typically roll-formed shapes.

The actual load applied by the solar panel assembly 12 through the purlins 42 and cross beam 36 to the post 30 when the solar panel assembly 12 is subject to a wind loading is less than a design load for the solar panel assembly 12 subject to the wind loading based on a sum of a first-solar-panel net pressure for the first solar panel, a second-solar-panel net pressure for the second solar panel, and a third-solar-panel net pressure load for the third solar panel, when the first-solar-panel net pressure, the second-solar-panel net pressure and the third-solar-panel net pressure load are determined independently. See, FIGS. 5, 6A and 6B.

Figure 7:
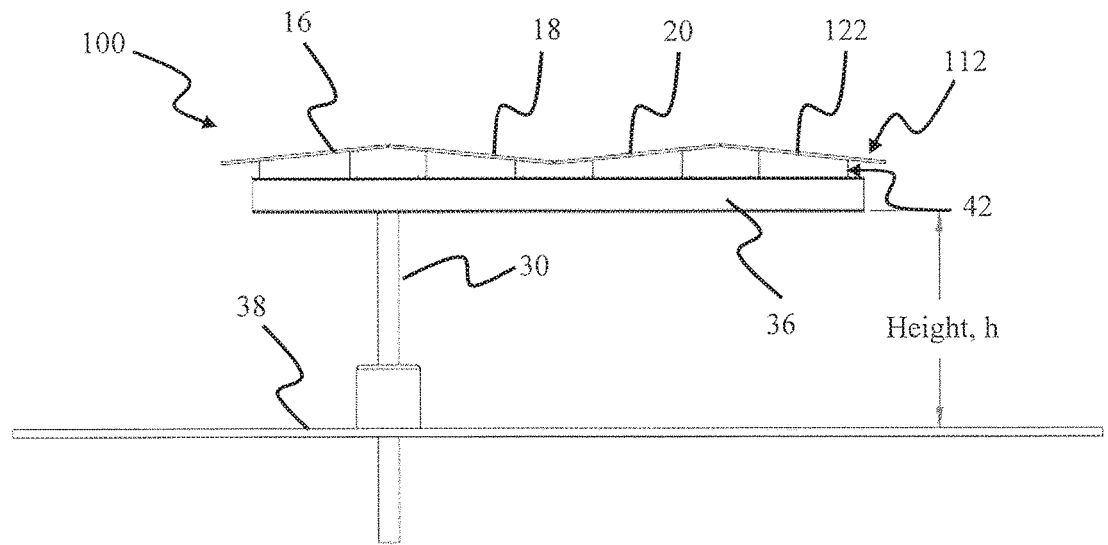
FIG. 7 is a side elevation view of a preferred embodiment of a solar panel assembly comprising four non-parallel panel surfaces in accordance with the present invention.
Figure 8:
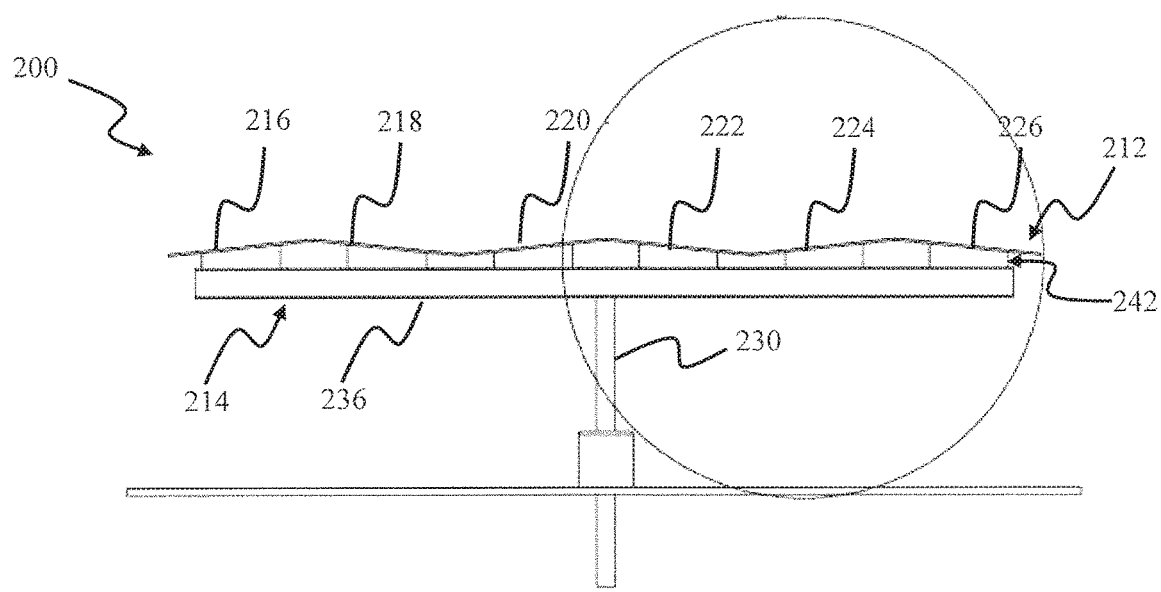
FIG. 8 is a side elevation view of a preferred embodiment of a solar panel assembly comprising six non-parallel panel surfaces in accordance with the present invention.

FIG. 7 shows another preferred embodiment of the solar canopy, generally designated 100, and hereinafter referred to as the "canopy" 100 in accordance with the present invention. The canopy 100 (also designated a 4P canopy) has substantially the same structure as the canopy 10 disclosed above but for a fourth solar panel 122. Similar to the canopy 10, the canopy 100 has a solar panel assembly 112 comprising solar panels oriented non-parallel with respect to adjacent solar panels.

Figure 9:
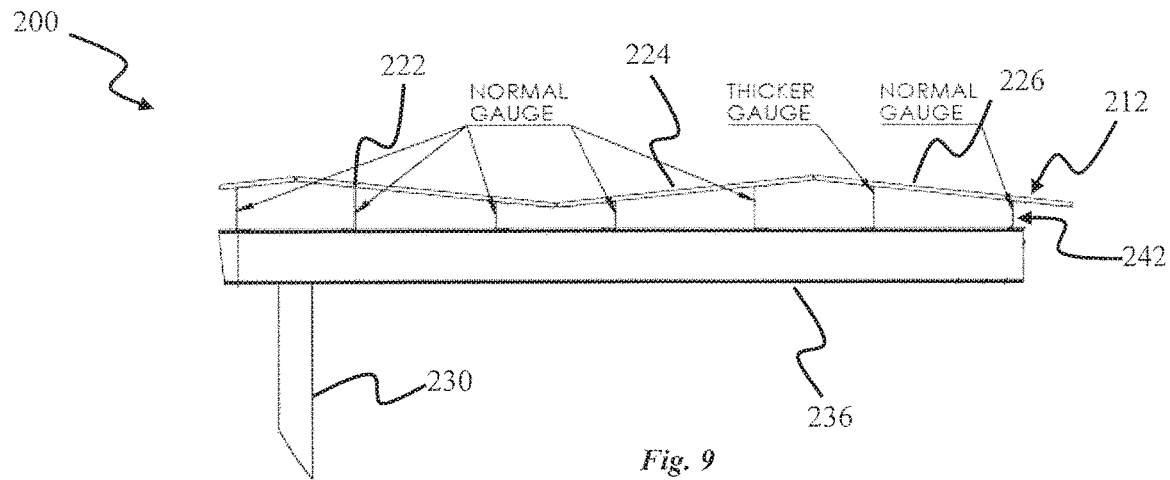
FIG. 9 is an enlarged portion of the solar panel assembly of FIG. 8.
Figure 10:
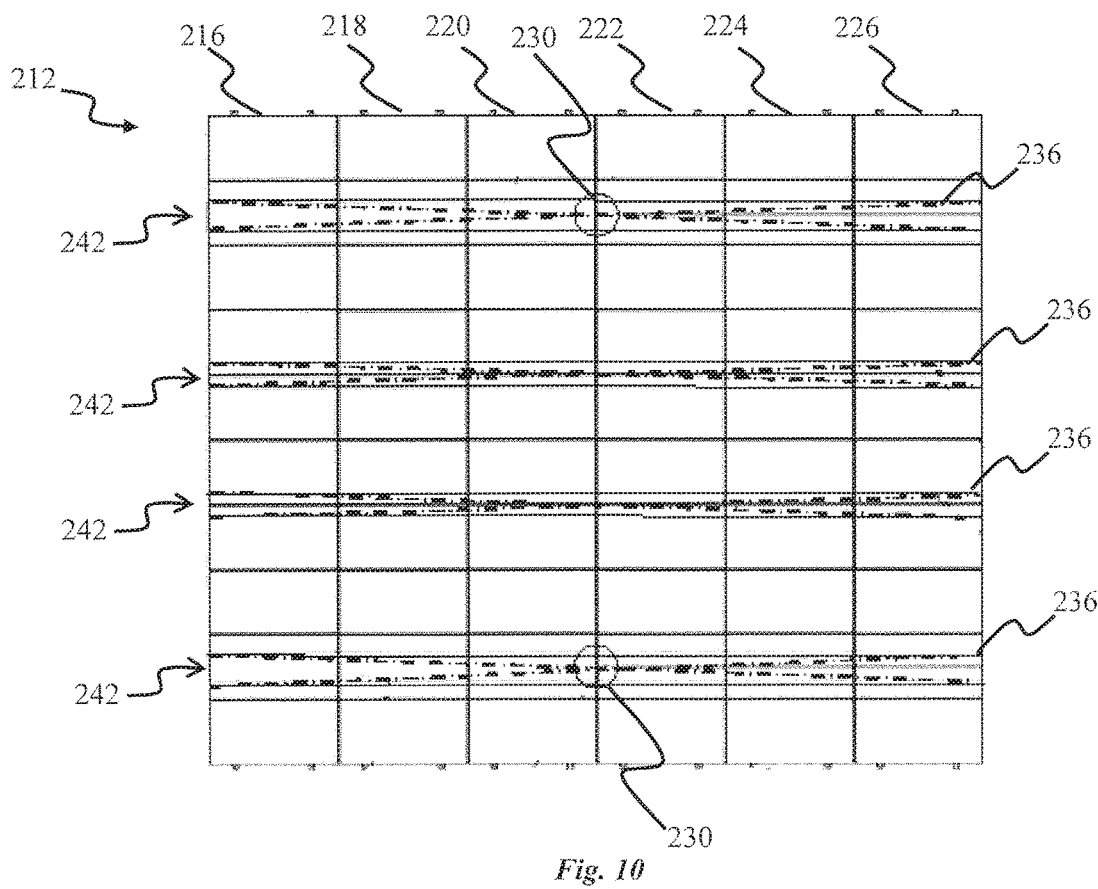
FIG. 10 is a top view of the solar panel assembly of FIG. 8.
Figure 11:
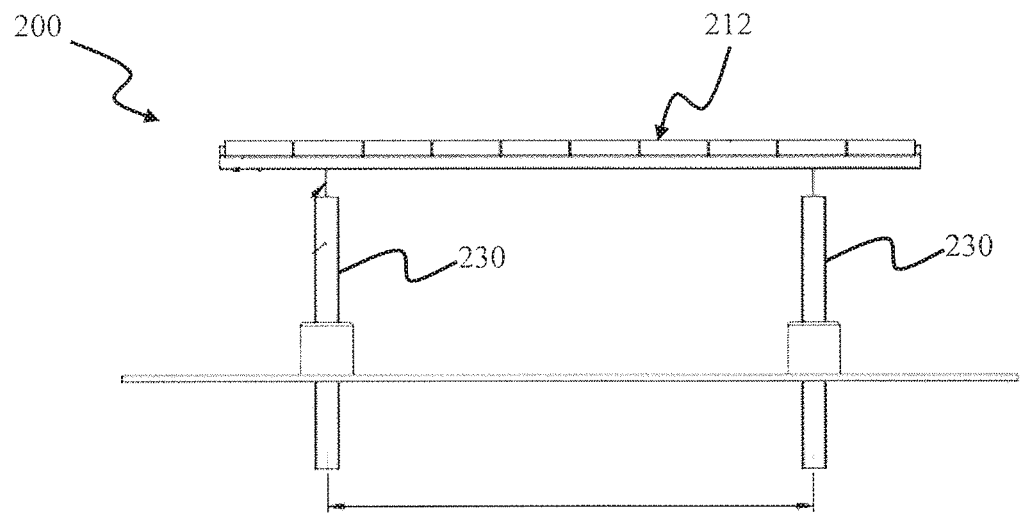
FIG. 11 is a right side elevation view of the solar panel assembly of FIG. 8.
Figure 12:
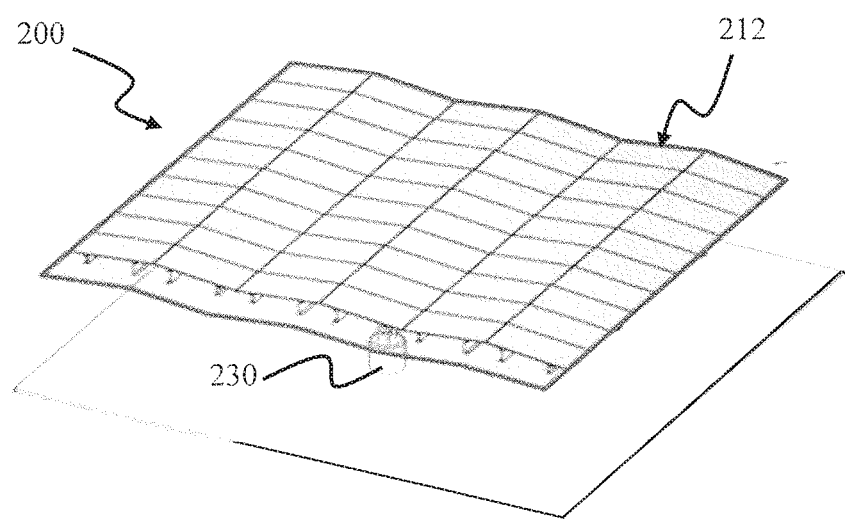
FIG. 12 is a top perspective view of the solar panel assembly of FIG. 8.

FIGS. 8-12 show still another preferred embodiment of the solar canopy, generally designated 200, and hereinafter referred to as the "canopy" 200 in accordance with the present invention. The canopy 200 (also designated a 6P canopy) has substantially the same structure as the canopy 10 and the canopy 100 disclosed above with the exception that the canopy 200 has a solar panel assembly 212 comprising a plurality of rows of six solar panel 216, 218, 220, 222, 224, 226 and the due to the size of the solar panel assembly support structure 214 comprises a plurality of beams 236 coupled to the solar panels by a plurality of mini-zee purlins 242 and is supported by two posts 230 (See, FIGS. 10-12). Referring to FIG. 9, the purlins 242 may vary in length and gauge depending on the distribution of the wind loading over the surface of the array solar panels.

Although three preferred embodiments of solar canopies in accordance with the present invention have been disclosed, the invention is not limited to these three canopies. The size of the solar panel assembly is a design choice based on the desired electrical output of the assembly. Other embodiments may include more than rows of six solar panels or less than rows of six solar panels within the spirit of the invention. Similarly, the number and distribution of the posts, cross beams and purlins comprising the solar-panel-assembly support structure is based on determining the net instantaneous wind loading across the total combined area of the non-parallel planes of solar panels.

The design methodology for the foregoing canopy support structures having two or more non-parallel planes of solar panels is based on determining the net instantaneous wind loading across the total combined area of the non-parallel planes of solar panels. Referring to FIGS. 7A and 7B, force coefficient $GC_P$ and moment coefficients $GC_{MHy}$, $GC_{My}$, defined by the following equations are calculated from wind tunnel pressure data and are used to size all components of the solar-panel-assembly support structure.

$$GC_P = \frac{F_{normal}}{q_H \cdot A} \qquad \text{Eq. 1}$$

$$GC_{MHy} = \frac{M_{top\_of\_post}}{q_H \cdot A \cdot L} \qquad \text{Eq. 2}$$

$$GC_{My} = \frac{M_{grade}}{q_H \cdot A \cdot L} \qquad \text{Eq. 3}$$

Where,
$F_{normal}$ is the force normal to the top surface of the PV modules;
$M_{top\_of\_post}$ is the moment about the top of post (center of the cross beam);
$M_{grade}$ is the moment about the grade;
$q_H$ is the ASCE 7 velocity pressure at a height (H) of ≤4.5 m in open terrain;
A is the averaging area (No. of panels multiplied by 2 m$^2$); and
L is the nominal chord length (6 m for 3P System, 8 m for 4 P System, and 12 m for 6P System).

The wind tunnel pressure data is obtained by simultaneously measuring the pressure at pressure taps embedded in the surfaces of panels comprising the solar panel assembly to be supported by the solar-panel-assembly support structure.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:
1. A solar canopy comprising:
a solar panel assembly comprising:
a first solar panel having a total wind-exposed first-solar-panel surface area; and
a second solar panel having a total wind-exposed second-solar-panel surface area, wherein the second solar panel is fixedly coupled to the first solar panel and wherein the total wind-exposed second-solar-panel surface area has a non-parallel orientation with respect to the total wind-exposed first-solar-panel surface area, and a solar-panel-assembly support structure coupled to the solar panel assembly;

wherein a maximum load the solar-panel-assembly support structure is designed to support is a determined load applied to the solar-panel-assembly support structure by the solar panel assembly when the solar panel assembly is subject to a wind loading, the determined load obtained by simultaneously measuring a load at a plurality of taps embedded in a total wind exposed first exemplary solar panel surface area of a first exemplary solar panel and a total wind exposed second exemplary solar panel surface area of a second exemplary solar panel with the non-parallel orientation during a wind tunnel test; and wherein the determined load is less than an aggregate load for the solar panel assembly subject to the wind loading, the aggregate load calculated by summing a standard first-solar-panel net pressure for the first solar panel and a standard second-solar-panel net pressure for the second solar panel, the standard first-solar-panel net pressure and the standard second-solar-panel net pressure determined independently.

2. The solar canopy of claim 1, wherein the solar panel assembly has a third solar panel with a total wind-exposed third-solar-panel surface area, the third solar panel coupled to the second solar panel and having a non-parallel orientation with respect to the total wind-exposed second-solar-panel surface area.

3. The solar canopy of claim 2, wherein the solar panel assembly is a rectilinear array of a plurality of solar panels including the first solar panel, the second solar panel and the third solar panel.

4. The solar canopy of claim 3, wherein the rectilinear array comprises at least an adjacent six rows with three solar panels of the plurality of solar panels per row.

5. The solar canopy of claim 1, wherein the first solar panel and the second solar panel are tilted at a tilt angle of about five degrees to about seven degrees from horizontal, the first solar panel being tilted in a counter clockwise direction and the second solar panel being tilted in a clockwise direction.

6. The solar canopy of claim 5, wherein the solar panel assembly has a third solar panel with a total wind-exposed third-solar-panel surface area, the third solar panel coupled to the second solar panel and tilted parallel to the first solar panel.

7. The solar canopy of claim 5, wherein the solar panel assembly has a third solar panel with a total wind-exposed third-solar-panel surface area, the third solar panel coupled to the second solar panel, oriented non-parallel with respect to the first solar panel and tilted in the counter clockwise direction at another tilt angle different than a tilt angle of the first solar panel.

8. The solar canopy of claim 1, wherein the actual load applied to the solar-panel-assembly support structure is determined by a force coefficient $GC_P$, a first moment coefficient $GC_{MHy}$, and a second moment coefficient $GC_{My}$, defined by the following equations:

$$GC_P = \frac{F_{normal}}{q_H \cdot A}$$

$$GC_{MHy} = \frac{M_{top\_of\_post}}{q_H \cdot A \cdot L}$$

$$GC_{My} = \frac{M_{grade}}{q_H \cdot A \cdot L}$$

where, $F_{normal}$ is a force normal to a top surface of the first solar panel or the second solar panel;

$M_{top\_of\_post}$ is a moment about a top of a post (center of a cross beam);

$M_{grade}$ is a moment about a bottom of the post;

$q_H$ is a velocity pressure at a height (H) of ≤4.5 m in an open terrain;

A is a averaging area (Number of panels multiplied by 2 m$^2$); and

L is a nominal chord length, and wherein the force coefficient $GC_P$, the first moment coefficient $GC_{MHy}$, and the second moment coefficient $GC_{My}$, are calculated from wind tunnel pressure data obtained by simultaneously measuring a pressure at a plurality of pressure taps embedded in a surface of the first and second solar panels.

9. The solar canopy of claim 1, wherein a plurality of purlins extend substantially vertically between a cross beam and the first-solar-panel and between the cross beam and the second-solar-panel and varying in length to achieve a desired tilt of the first and second solar panels.

10. A solar canopy comprising:

a solar panel assembly comprising:
a first solar panel having a first orientation; and
a second solar panel coupled to the first solar panel and having a second orientation that is non-parallel to the first orientation;
wherein the second solar panel is fixedly coupled to the first solar panel; and a solar-panel-assembly support structure coupled to the solar panel assembly;

wherein a maximum load the solar-panel-assembly support structure is designed to support is a determined load applied to the solar-panel-assembly support structure by the solar panel assembly when the solar panel assembly is subject to a wind loading, the determined load obtained by simultaneously measuring a load at a plurality of taps embedded in a total wind exposed first exemplary solar panel surface area of a first exemplary solar panel and a total wind exposed second exemplary solar panel surface area of a second exemplary solar panel with the non-parallel orientation during a wind tunnel test; and wherein the determined load is less than an aggregate load for the solar panel assembly subject to the wind loading, the aggregate load calculated by summing a standard first-solar-panel net pressure for the first solar panel and a standard second-solar-panel net pressure for the second solar panel, the standard first-solar-panel net pressure and the standard second-solar-panel net pressure determined independently.

11. The solar canopy of claim 10, wherein the solar panel assembly has a third solar panel with a total wind-exposed third-solar-panel surface area, the third solar panel coupled to the second solar panel and having a non-parallel orientation with respect to the total wind-exposed second-solar-panel surface area.

12. The solar canopy of claim 11, wherein the solar panel assembly is a rectilinear array of a plurality of solar panels including the first solar panel, the second solar panel and the third solar panel.

13. The solar canopy of claim 12, wherein the rectilinear array comprises at least an adjacent six rows with three solar panels of the plurality of solar panels per row.

14. The solar canopy of claim 10, wherein the first solar panel and the second solar panel are tilted at a tilt angle of about five degrees to about seven degrees from horizontal, the first solar panel being tilted in a counter clockwise direction and the second solar panel being tilted in a clockwise direction.

15. The solar canopy of claim 14, wherein the solar panel assembly has a third solar panel with a total wind-exposed third-solar-panel surface area, the third solar panel coupled to the second solar panel and tilted parallel to the first solar panel.

16. The solar canopy of claim 14, wherein the solar panel assembly has a third solar panel with a total wind-exposed third-solar-panel surface area, the third solar panel coupled to the second solar panel, oriented non-parallel with respect to the first solar panel and tilted in the counter clockwise direction at another tilt angle different than a tilt angle of the first solar panel.

17. The solar canopy of claim 10, wherein the actual load applied to the solar-panel-assembly support structure is determined by a force coefficient $GC_P$, a first moment coefficient $GC_{MHy}$, and a second moment coefficient $GC_{My}$ defined by the following equations:

$$GC_P = \frac{F_{normal}}{q_H \cdot A}$$

$$GC_{MHy} = \frac{M_{top\_of\_post}}{q_H \cdot A \cdot L}$$

$$GC_{My} = \frac{M_{grade}}{q_H \cdot A \cdot L}$$

where,
$F_{normal}$ is a force normal to a top surface of the first solar panel or the second solar panel;
$M_{top\_of\_post}$ is a moment about a top of a post (center of a cross beam);
$M_{grade}$ is a moment about a bottom of the post;
$q_H$ is a velocity pressure at a height (H) of ≤4.5 m in an open terrain;
A is a averaging area (Number of panels multiplied by 2 m$^2$); and
L is a nominal chord length, and
wherein the force coefficient $GC_P$, the first moment coefficient $GC_{MHy}$, and the second moment coefficient $GC_{My}$ are calculated from wind tunnel pressure data obtained by simultaneously measuring a pressure at a plurality of pressure taps embedded in a surface of the first and second solar panels.

18. The solar canopy of claim 10, wherein a plurality of purlins extend substantially vertically between a cross beam and the first-solar-panel and between the cross beam and the second-solar-panel and varying in length to achieve a desired tilt of the first and second solar panels.

19. The solar canopy of claim 1, wherein the first-solar-panel net pressure and the second-solar-panel net pressure are determined by wind tunnel testing.

20. The solar canopy of claim 10, wherein the first-solar-panel net pressure and the second-solar-panel net pressure are determined by wind tunnel testing.

* * * * *